United States Patent [19]

Hallee et al.

[11] Patent Number: 5,386,393
[45] Date of Patent: Jan. 31, 1995

[54] FENCING CIRCUIT AND METHOD FOR ISOLATING SPURIOUS NOISE AT SYSTEM INTERFACE

[75] Inventors: Edward C. Hallee; Suo-Lun Huang, both of Wappingers Falls; Kirk H. Hwang; Benedicto U. Messina, both of Poughkeepsie, all of N.Y.

[73] Assignee: International Business Machines Corporation, Armonk, N.Y.

[21] Appl. No.: 14,978

[22] Filed: Feb. 8, 1993

[51] Int. Cl.$^6$ .................... H04B 15/00; H02H 1/04
[52] U.S. Cl. ................... 364/574; 364/572; 371/4; 361/212; 327/310; 327/384
[58] Field of Search ................ 364/572, 574; 371/4; 307/542.1, 542; 361/111, 212, 56, 91

[56] References Cited

U.S. PATENT DOCUMENTS

| | | | |
|---|---|---|---|
| 4,057,738 | 11/1977 | Nishimura | 307/542.1 |
| 4,082,218 | 4/1978 | Paulinski | 371/4 |
| 4,181,861 | 1/1980 | Maehashi | 307/542.1 X |
| 4,523,104 | 6/1985 | Norris et al. | 307/542.1 |
| 5,001,374 | 3/1991 | Chang | 307/542.1 |
| 5,014,155 | 5/1991 | Abe et al. | 307/542.1 X |
| 5,059,834 | 10/1991 | Tago et al. | 307/542.1 X |
| 5,265,038 | 11/1993 | Kwok | 364/574 X |

OTHER PUBLICATIONS

Wilcox et al., "The Elimination of Electrostatis Discharge Failures from Silicon Gate Logic Technologies," IBM Technical Report Aug. 1985.

Primary Examiner—Emanuel T. Voeltz
Assistant Examiner—Eric W. Stamber
Attorney, Agent, or Firm—Lawrence D. Cutter; Kevin D. Radigan

[57] ABSTRACT

Logic fencing circuit and method are provided for increasing system protection at a multiprocessor system interface so that spurious noise (e.g., attributable to an electrostatic discharge through a signal cable) is more reliably isolated from an active portion of the processing system. The noise fencing circuit, which is responsive to a fence control signal, includes logic circuitry for attenuating a received noise signal by constraining the noise signal to a magnitude less than or equal to the voltage level of a system power supply. The attenuating circuitry outputs an attenuated noise signal to a signal fence circuit which, when enabled by the fence control signal, outputs a substantially constant isolation signal in response to a received, attenuated noise signal. A logically staged fencing method is also set forth.

8 Claims, 2 Drawing Sheets

FENCING CIRCUIT AND METHOD FOR ISOLATING SPURIOUS NOISE AT SYSTEM INTERFACE

TECHNICAL FIELD

The present invention relates in general to spurious noise filtering within a computer processing system, and more particularly, to an enhanced logic fencing circuit and method for increasing system protection at a system interface such that non-destructive spurious noise (e.g., attributable to an electrostatic discharge (ESD) from a signal cable) is reliably isolated from the processing system.

BACKGROUND ART

Obviously, in today's high availability multiple processing systems it is desirable to avoid the occurrence of unplanned downtime. Designers of large multiprocessing systems improve the availability of such systems by providing for continuous operation through parallel maintenance. This operation is referred to in the art as "concurrent maintenance." The ability to upgrade the system through mechanical rework in situ while causing no more than a brief interruption in the customer's need for continuous operation is an important marketing advantage of certain large multiprocessor systems. A prerequisite to implementation of a concurrent maintenance scheme, however, is the construction of a viable fencing technique. Fencing is used, for example, by system designers to block logic signals and logic noise at interfaces to be partitioned during a concurrent maintenance operation.

The object of any fencing technique is to isolate spurious noise (such as triboelectric charge occurring on a signal cable) from being transferred to an active system interface. By way of example, interfaces exist in most systems where signal cables interconnect I/O devices, such as keyboards and display terminals. Also, they exist internally to computer processing systems, for example, between chips and modules of the same processing element, or of a different processing element in a multiprocessor system.

As one possible approach to reducing the effects of spurious noise, significant effort has been expended in the art to designing signal cables which reduce or eliminate the buildup of electrostatic charge thereon. However, such a solution is often expensive and only addresses one type of spurious noise, i.e., triboelectric charge. (The static charge imbalance on a signal cable is satisfied when the signal and ground leads first make contact to a conductive source, e.g., an active computer system interface.)

Spurious noise can result in a current surge which in certain cases is sufficient to drive through a conventionally fenced receiver circuit and cause interruptions to the active portion of the computer processing system. This significant conclusion has only just now been reached after significant hours of studying processing systems in physical partition mode (again, for conducting system maintenance or upgrading). Specifically, notwithstanding the existence of conventional logic fencing at system interfaces, certain types of spurious noise (such as static discharges) continue to intermittently drive through the traditional fencing logic protection and cause errors to occur within an active portion of the multiprocessor system.

Thus, the present invention attempts to address this surprising source of system errors (i.e., the intermittent breakdown of conventional fencing circuitry) and in so doing enhance continuous operation of a multiprocessor system during maintenance periods and/or model upgrades. Without a viable fencing design, many of the error recovery and error isolation techniques used by system designers become virtually impossible to implement. If fencing is not reliable, status and error information cannot be acted upon with predictable results.

DISCLOSURE OF INVENTION

Briefly summarized, the invention comprises, in a first aspect, a noise fencing circuit for a processor system interface. The processor system is assumed to be driven by at least one power supply providing a substantially defined voltage to logic circuitry within the system. Also, the noise fencing circuit is responsive to a fence control signal generated from within the system. The noise fencing circuit includes logic circuitry for attenuating a received noise signal at the processor system interface by constraining the noise signal to a magnitude less than or equal to the at least one power supply's defined voltage. The attenuating logic circuitry outputs an attenuated noise signal in response to a received noise signal at the processor system interface. Connected to the attenuating logic circuitry is a signal fencing circuit for receiving the attenuated noise signal. The enable/disable state of the signal fence circuit is responsive to the fence control signal. When the fence operation is enabled, the signal fencing circuit outputs a substantially constant isolation signal in response to a received, attenuated noise signal.

Additional specific details of the noise fencing circuit are provided and claimed herein.

In another aspect, a novel noise fencing method is provided for isolating signals at a processing system interface. The processing system is assumed to be driven by at least one power supply which provides a substantially defined voltage. The noise fencing method includes the steps of: receiving a noise signal at the processing system interface; constraining the received noise signal to a magnitude less than or equal to the at least one power supply's defined voltage such that an attenuated noise signal is produced; providing a fencing circuit responsive to a fence control signal and coupled to receive the attenuated noise signal (the fencing circuit being enabled/disabled by the fence control signal); and whenever the fencing circuit is enabled by the fence control signal, outputting from the fencing circuit a substantially constant isolation signal in response to a received, attenuated noise signal.

To summarize, an enhanced logic fencing circuit and method are provided for increasing system protection at a processing system interface. The technique employed performs better than previously known spurious noise isolation techniques. Greater reliability of the enhanced circuit and method presented herein ensures greater accuracy in error recovery and error isolation techniques commonly used by system designers, as well as allowing status and error information to be acted upon with more predictable results. Additionally, the technique presented ensures that maintenance and/or upgrades made in a concurrent maintenance manner can be accomplished without dropping power on the complete system. Because of the enhanced reliability, the probability that a spurious noise signal will cause system malfunction is reduced.

BRIEF DESCRIPTION OF DRAWINGS

These and other objects, advantages and features of the present invention will be more readily understood from the following detailed description of certain preferred embodiments of the present invention, when considered in conjunction with the accompanying drawings in which.

BEST MODE FOR CARRYING OUT THE INVENTION

Figure 1:
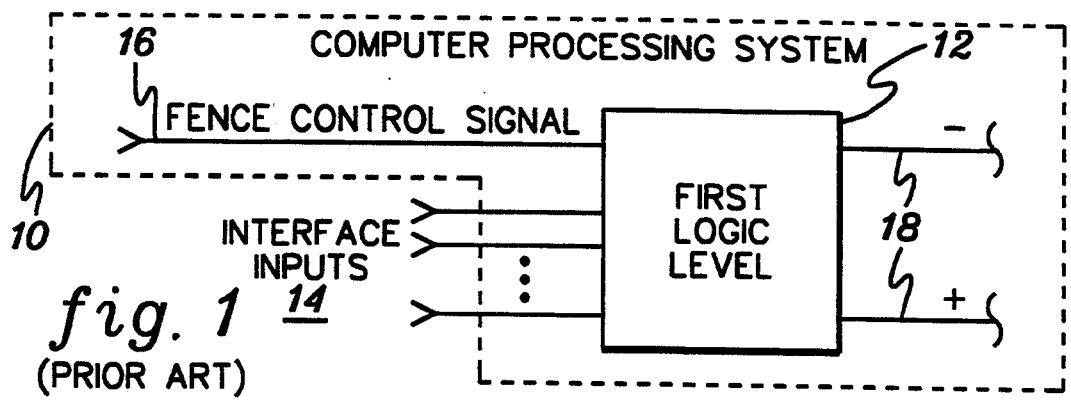
FIG. 1 is a representation of a prior art logic fencing implementation for a processor system interface.

A conventional noise fencing technique is first discussed in detail with reference to FIG. 1 of the accompanying drawings. A computer processing system 10, such as a multiprocessor system, traditionally incorporates noise fencing at a first logic level 12 at a system interface (for example, with a signal cable (not shown)). First logic level 12 receives signals from multiple interface inputs 14 and a fence control signal 16 from a supervisory controller (not shown) in a different portion of processing system 10.

Assuming that system 10 comprises a multiple processing system, then it is desirable to facilitate physical partitioning of the system for concurrent maintenance and/or upgrading of one or more processing elements within the system. During physical partitioning mode, it is necessary to isolate "down" processing elements from active processing elements. Typically, in conventional noise fencing, first logic level 12 is dedicated to a switching gate such as a NAND or OR circuit wherein, for example, if any input is high then the output on lines 18 is also high (i.e., "+"). Prior to this disclosure, it was assumed that if the fence control signal was high (for example) then a high signal would be output from first logic level 12 irrespective of any noise on inputs 14. After extensive analysis, it has been discovered that this assumption is not always correct.

The problem of intermittent, varied breakdown has existed in the art for a number of years. Extensive research has indicated that the assumptions made with respect to the inputs to the conventional fencing logic circuit can at times be invalid. This core recognition is central to the design of the present invention. On occasion, non-destructive spurious noise (such as triboelectric charge coupled to an interface from a signal cable) can exceed logic circuit design parameters by an order of magnitude or more. Thus, should (for example) a spike develop on one of the interface input lines 14, then notwithstanding the existence of a supposedly controlling signal on fence control signal line 16 (e.g., '+'), logic 12 may in sensing a large differential between the spike on inputs 14 and the control signal on line 16 toggle its output from a high to a low state (or, depending on the circuit, from a low to a high state). Should this happen, the fencing logic is essentially compromised and one or more stray signals are sent, for example, into the active portion of the multiprocessor system in physical partition mode.

Subsequent to the above-referenced discovery, the basic idea of the present invention evolved. Specifically, the invention exploits the fact that the output level of a logic circuit is more a function of the power supply voltage to the logic circuit than it is of the input signal level (or spurious noise level) on one or more input legs to the circuit. This behavior is resident within a simple logic circuit (such as a current switch emitter follower circuit), and is a characteristic which is key to understanding why the fencing technique of the present invention succeeds in isolating non-destructive noise at a system interface, while the conventional fencing approach can result in intermittent signals compromising the isolation fence.

Figure 2:
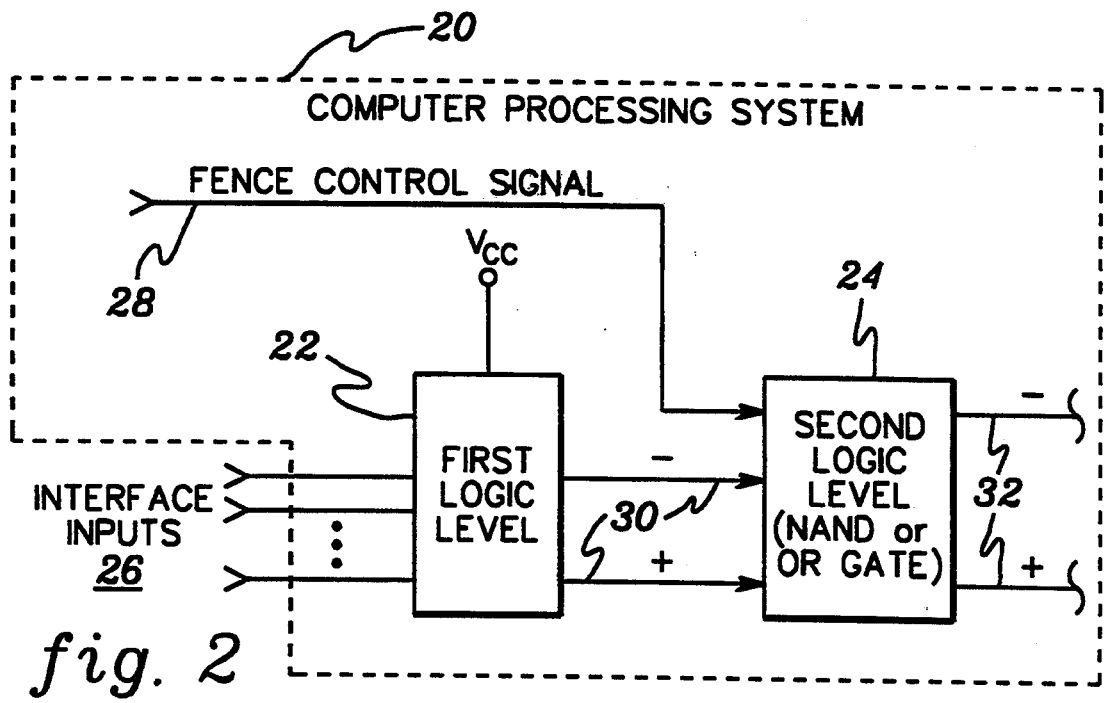
FIG. 2 is a block diagram representation of one fencing circuit embodiment pursuant to the present invention for a processor system interface.

A first embodiment of a noise fence circuit, generally denoted 20, pursuant to the present invention is shown in FIG. 2. As with system 10 of FIG. 1, system 20 of FIG. 2 may comprise a multiple processor system of which only a few stages of logic circuitry adjacent an interface input are depicted for discussion.

As shown in FIG. 2, the fencing function for noise isolation pursuant to the present invention is moved to a second logic level 24, which may, for example, comprise a NAND gate or an OR gate. Second logic level 24 is connected to receive the outputs 30 of a first logic level 22. First logic level 22 receives multiple interface inputs 26, one or more of which may contain spurious noise to be filtered pursuant to the fencing circuit of the present invention. In this embodiment, fence control signal 28 is fed directly to second logic level 24 and first logic level 22 is powered by a system supply voltage $V_{CC}$.

In operation, a non-destructive spike comprising spurious noise at one or more of the interface inputs 26 will necessarily result in an output on line 30 of first logic level 22 which is attenuated and of a magnitude less than or equal to power supply voltage $V_{CC}$. This attenuated noise signal output from first logic level 22 is fed to second logic level 24. By definition, the signal on lines 30 are thus within defined logic parameters such that the fencing circuitry of second logic level 24 will function as intended. (Second logic level 24 is either enabled or disabled by the control signal on line 28.) For example, if level 24 comprises a NAND circuit and if the fence control signal on line 28 is a high signal, then a constant low output on line 32 is provided by the fencing circuitry. Thus, the uncertainties caused by a large spurious noise signal have been effectively contained and the fencing circuitry functions as intended by outputting a constant signal. This is because the noise signals at the input to the second logic level 24 have been restricted to normal operating ranges of the fencing circuit.

Figure 3:
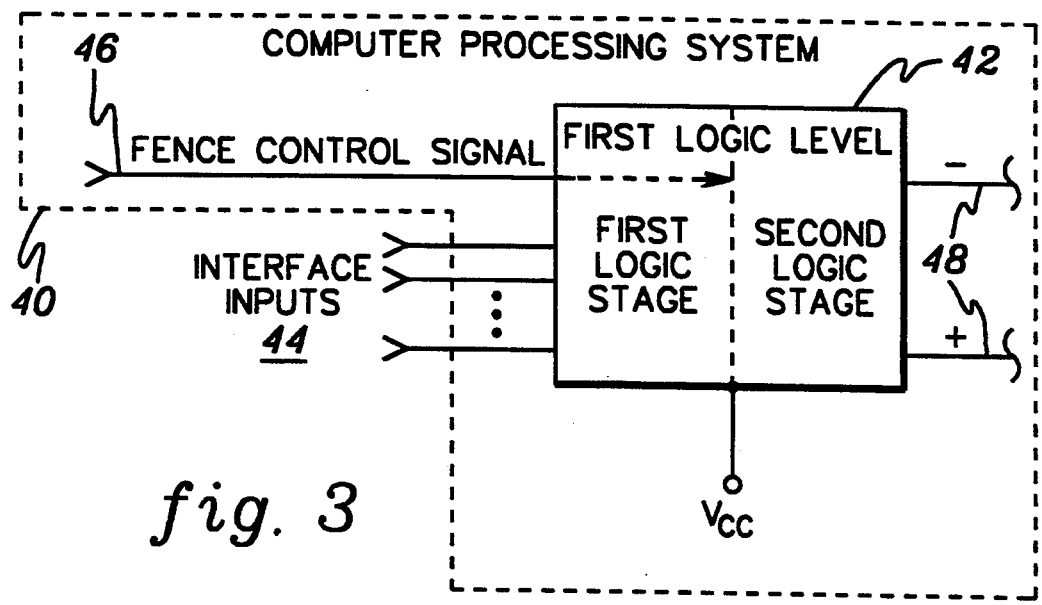
FIG. 3 is a block diagram representation of an alternate fencing circuit embodiment pursuant to the present invention for a processor system interface.

The added delay inherent in the fencing technique of FIG. 2 can be reduced by incorporating the fencing circuit into a first logic level such that two stages are defined within the first logic level. One embodiment of such an approach is depicted in FIG. 3.

A computer processing system 40, again which may comprise a multiple processing system, has a first logic level 42 which receives interface inputs 44 and a fence control signal 46. Level 42 is subdivided into a first logic stage and a successive second logic stage, and an output from first logic level 42 is provided on lines 48. The first logic stage is similar to first logic level 22 of processing system 20 of FIG. 2. In this stage, non-destructive spurious noise is attenuated and an attenuated noise signal is provided to the second logic stage, which would comprise logic circuitry to implement the fencing operation. Again, spurious noise on one of the interface inputs 44 is constrained by the first logic stage to be less than or equal to a system supply voltage $V_{CC}$. In a further embodiment, other logic functions associated with the processor system interface can be incorporated into the first logic stage in addition to the noise attenuating logic. The second logic stage outputs on lines 48 a constant isolation signal when enabled by fence control signal 46 irrespective of the signals on interface inputs 44. Again, the concept of the present invention is to first filter or attenuate the spurious noise before undertaking the fencing operation.

Figure 4:
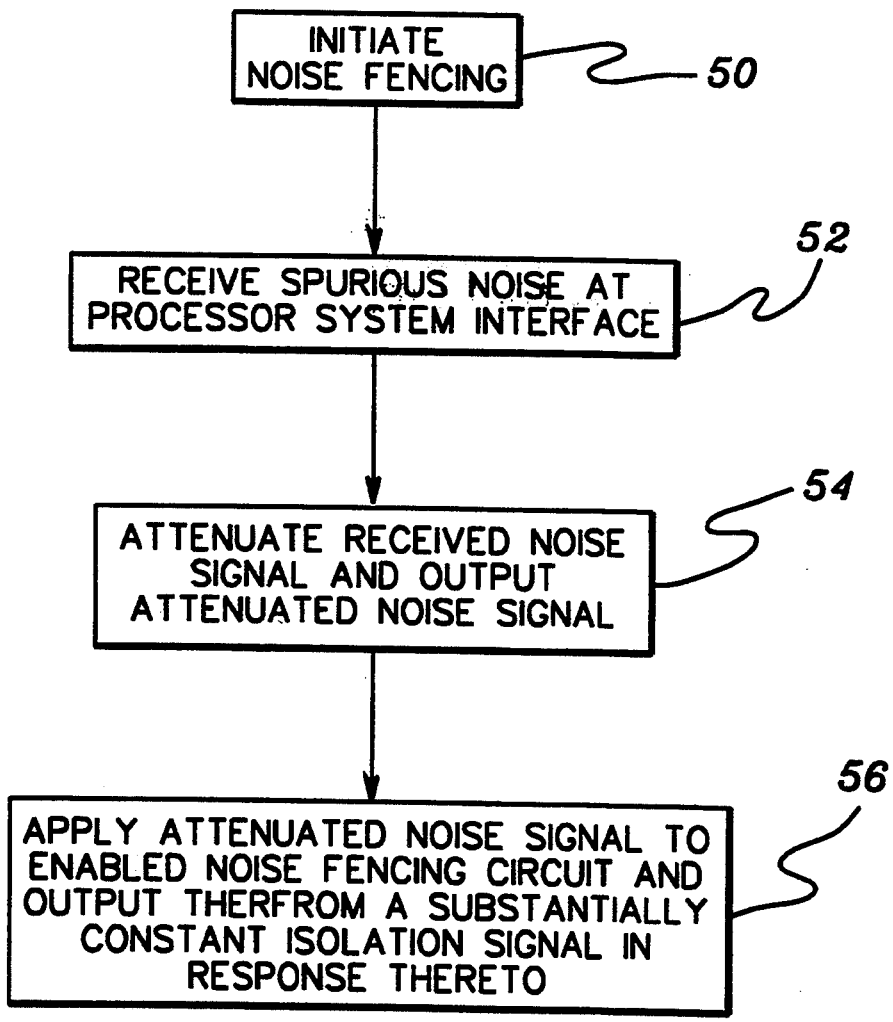
FIG. 4 is a flowchart of one spurious noise processing embodiment pursuant to the present invention.

An overview of a fencing method pursuant to the present invention is provided in FIG. 4. Noise fencing is initiated, 50 "Initiate Noise Fencing," by enabling the fencing circuitry, for example, forcing a constant output from level 24 of FIG. 2 or the second logic stage of FIG. 3. Spurious noise is received at the processor system interface, 52 "Receive Spurious Noise At Processor System Interface," and the noise is attenuated such that an attenuated noise signal is output which by definition is less than or equal to a power supply voltage $V_{CC}$, 54 "Attenuate Received Noise Signal And Output Attenuated Noise Signal." Finally, the attenuated noise signal is applied to an enabled noise fencing circuit and output therefrom is a substantially constant isolation signal, 56 "Apply Attenuated Noise Signal To Enabled Noise Fencing Circuit & Output Therefrom A Substantially Constant Isolation Signal in Response Thereto."

To summarize, an enhanced logic fencing circuit and method are provided for increasing system protection at a processing system interface or signal system interface such that spurious noise is isolated from an active portion of the processing system. Greater reliability of the enhanced circuit and method presented herein ensures greater accuracy in error recovery and error isolation techniques used by system designers, as well as allowing status and error information to be acted upon with more predictable results. Additionally, the technique presented ensures that maintenance and/or upgrades made in a concurrent maintenance manner can be accomplished without dropping power on the complete system. Because of the enhanced performance, the probability that a spurious noise signal will cause system malfunction is reduced.

Whereas the above description has been particularly addressed to computer and data processing systems, it should also be pointed out that the method and apparatus of the present invention is equally applicable to any signal level apparatus driven or powered at one or more power level voltage sources, and containing logic circuitry at an external interface, such as a cable or connector coupling.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

We claim:

1. A noise fencing circuit for an interface of a processor system, said processor system being driven by at least one power supply which provides a substantially defined voltage, said noise fencing circuit being responsive to a fence control signal, said noise fencing circuit comprising:

logic circuit means for attenuating a received noise signal at said processor system interface by constraining said received noise signal to a magnitude less than or equal to said at least one power supply's defined voltage, said logic circuit attenuating means outputting an attenuated noise signal in response to a received noise signal at said processor system interface; and signal fencing means, responsive to said fence control signal and connected to said logic circuit attenuating means for receiving said attenuated noise signal therefrom, said signal fencing means being enabled or disabled by said fence control signal, wherein when enabled, said signal fencing means includes means for outputting a substantially constant isolation signal in response to a received, attenuated noise signal.

2. The noise fencing circuit of claim 1, wherein said logic circuit attenuating means comprises a first logic circuit stage and said signal fencing means comprises a second logic circuit stage, said first and second logic circuit stages being successively connected at said processor system interface such that said second logic circuit stage receives an output from said first logic circuit stage.

3. The noise fencing circuit of claim 2, wherein said processor system includes multiple logic levels and wherein said first logic circuit stage and said second logic circuit stage are incorporated into a first logic level of said processor system's multiple logic levels relative to said processor system interface.

4. The noise fencing circuit of claim 1, wherein said logic circuit attenuating means executes at least one other desired logic function for said processor system.

5. The noise fencing circuit of claim 1, wherein said signal fencing means includes either a selected 'NAND' gate having multiple inputs or a selected 'OR' gate having multiple inputs, one input to the selected multiple input gate receiving said fence control signal.

6. The noise fencing circuit of claim 1, wherein said processor system comprises a multiprocessor system and wherein said noise fencing circuit is disposed internal to said processor system between at least two of the multiple processors within said multiprocessor system such that concurrent maintenance of one processor of said multiprocessor system may be conducted while another processor of said multiprocessor system remains active.

7. A method for noise fencing at an interface of a processing system, said processing system being driven by at least one power supply providing a substantiality defined voltage, said noise fencing method comprising the steps of:

(a) receiving a noise signal at said processing system interface;

(b) constraining the received noise signal to a magnitude less than or equal to said at least one power supply's defined voltage such that an attenuated noise signal is produced;

(c) providing a fencing circuit responsive to a fence control signal and coupled to receive an attenuated noise signal produced in said step (b), said fencing circuit being enabled or disabled by said fence control signal; and (d) whenever said fencing circuit is enabled by said fence control signal, outputting from said fencing circuit a substantially constant isolation signal in response to a received, attenuated noise signal.

8. A noise fencing circuit for an interface of a signal system, said signal system including at least one power supply which provides a substantially defined voltage, said noise fencing circuit being responsive to a fence control signal, said noise fencing circuit comprising:

logic circuit means for attenuating a received noise signal at said signal system interface by constraining said received noise signal to a magnitude less than or equal to said at least one power supply's defined voltage, said logic circuit attenuating means outputting an attenuated noise signal in response to a received noise signal at said signal system interface; and signal fencing means, responsive to said fence control signal and connected to said logic circuit attenuating means for receiving said attenuated noise signal therefrom, said signal fencing means being enabled or disabled by said fence control signal, wherein when enabled, said signal fencing means includes means for outputting a substantially constant isolation signal in response to a received, attenuated noise signal.

* * * * *